Feb. 17, 1970 R. VAUGHAN 3,495,512

METHOD AND APPARATUS FOR THE PRODUCTION OF MASKS FOR USE IN THE MANUFACTURE OF PLANAR TRANSISTORS AND INTEGRATED CIRCUITS

Filed Dec. 1, 1967 3 Sheets-Sheet 1

INVENTOR
RICHARD VAUGHAN
BY McGlew and Toren
Attorneys

Feb. 17, 1970 R. VAUGHAN 3,495,512

METHOD AND APPARATUS FOR THE PRODUCTION OF MASKS FOR USE IN THE MANUFACTURE OF PLANAR TRANSISTORS AND INTEGRATED CIRCUITS

Filed Dec. 1, 1967 3 Sheets-Sheet 2

INVENTOR

RICHARD VAUGHAN

By McGlew and Toren

Attorneys

Feb. 17, 1970 R. VAUGHAN 3,495,512
METHOD AND APPARATUS FOR THE PRODUCTION OF MASKS FOR USE IN THE MANUFACTURE OF PLANAR TRANSISTORS AND INTEGRATED CIRCUITS
Filed Dec. 1, 1967 3 Sheets-Sheet 3
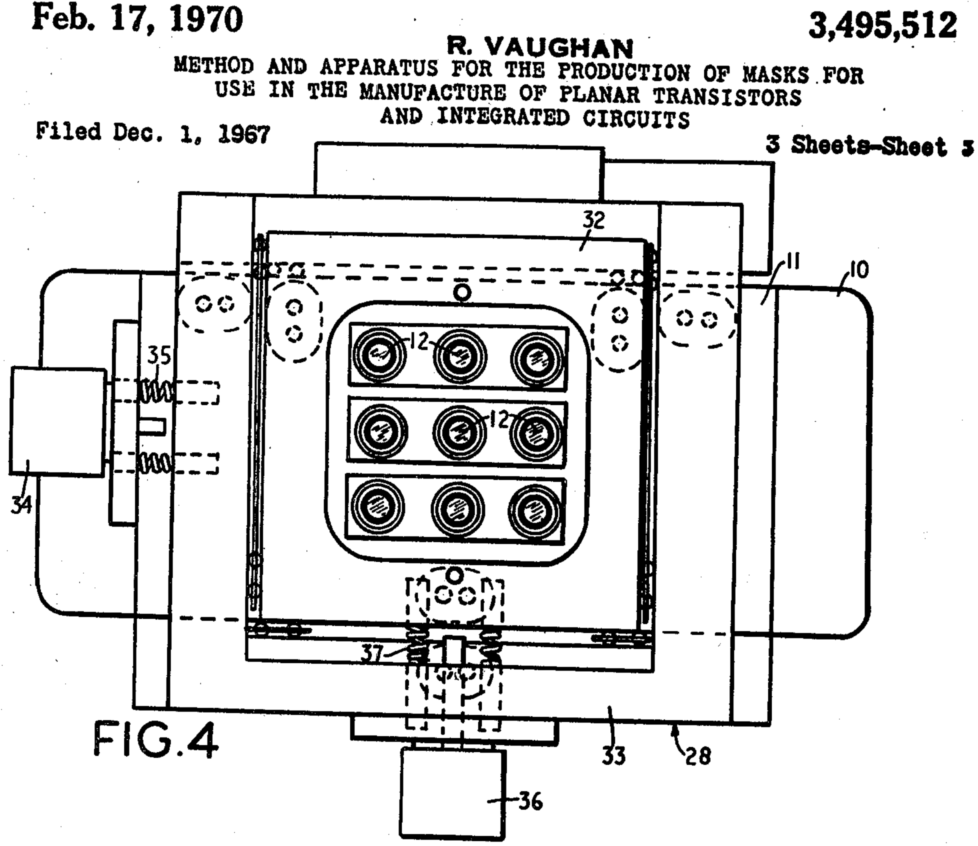
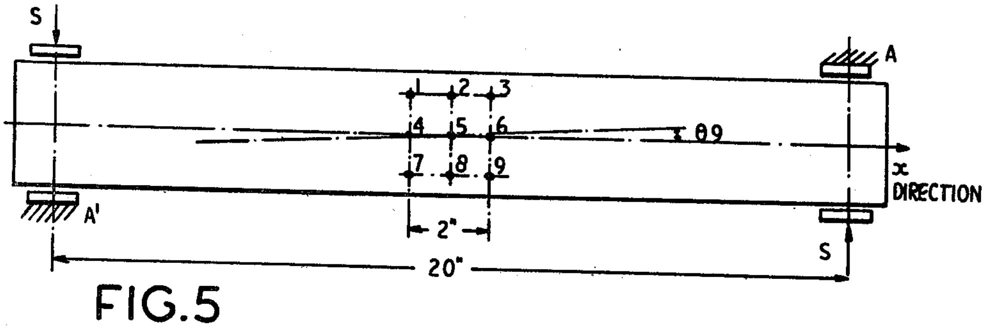
FIG.5
L2
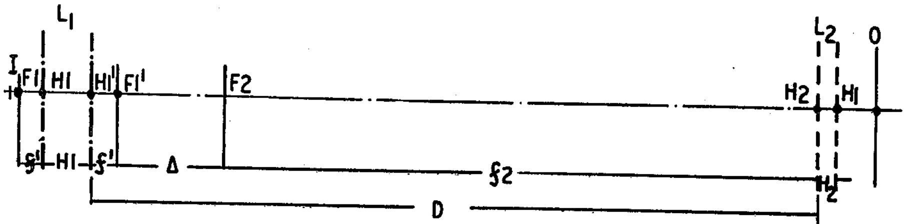
FIG.6
INVENTOR
RICHARD VAUGHAN
By MacGlew and Toren
Attorneys United States Patent Office 3,495,512

Patented Feb. 17, 1970

3,495,512
METHOD AND APPARATUS FOR THE PRODUCTION OF MASKS FOR USE IN THE MANUFACTURE OF PLANAR TRANSISTORS AND INTEGRATED CIRCUITS

Richard Vaughan, Maroubra, New South Wales, Australia, assignor to Unisearch Limited, University of New South Wales, Australia, a corporation of New South Wales, Australia Filed Dec. 1, 1967, Ser. No. 687,198
Claims priority, application Australia, Dec. 5, 1966, 14,820/66
Int. Cl. G03b *27/42, 27/44, 27/32*
U.S. Cl. 95—1 6 Claims

ABSTRACT OF THE DISCLOSURE

A method and apparatus for the production of high resolution masks for use in the manufacture of planar transistors and the like in which large scale artwork is prepared for each pattern and a pattern set is produced photographically on a photographic plate of, for example, 4" x 4". The plate so produced is set up before a number of high resolution microscope objective lenses, one for each pattern and all patterns exposed simultaneously to a second unexposed photographic plate on which, by a step and repeat procedure, a 1" x 1" mask set is produced, there being one mask in respect of each pattern.

Background of the invention

The present invention relates to a method and apparatus for the production of high resolution masks for use in the manufacture of planar transistors and integrated circuits by photolithographic techniques.

The manufacture of integrated circuits requires a set of masks. These masks are normally produced by photographic techniques. A different mask is required for each process step, typically from 6 to 9 masks being needed for a complete "mask-set." A different mask set is necessary for each different type of circuit manufacture. Each mask usually consists of an array of basic patterns repeated at a center-spacing of from $25\times10^{-3}$ inches to $50\times10^{-3}$ inches over an area of approximately 1 inch x 1 inch (corresponding to the size of a semiconductor wafer). The repeated pattern on each mask of a mask-set is different. Patterns in corresponding positions on different masks define a single basic circuit on the processed semiconductor wafer. Such corresponding patterns can be said to form a pattern-set. All corresponding patterns on the masks of a mask-set must be accurately aligned with each other. One of the limits to the performance and complexity of currently manufactured integrated circuits is set by the finest of detail achieved in the final patterns and by the accuracy of their alignment.

Finer pattern details, that is finer line widths, are desirable to improve packing density, circuit yield and high-frequency performance of integrated circuits. Since it is difficult in an optical system to obtain high resolution and freedom from aberration over a large area, it seems that the finest line widths will be achieved by using a microscope objective lens in reverse to obtain the final reduction of each basic pattern separately combined with a step-and-repeat procedure to build up the complete mask array. A microscope objective has been used to expose single patterns on a photo-resist coated chrome film-on-glass plate, and line widths of $1\mu$ over a 50 mil x 50 mil area and $0.5\mu$ over a 30 mil x 30 mil area have been achieved. However before such line widths can be used in practice, equipment must be available for performing the final step-and-repeat to accuracies less than the desired line width. An accuracy of less than $\frac{1}{10}$ x $0.5\mu\div1$ micro. in. would appear desirable.

Mask sets are at present made in the following manner. Firstly an artwork or drawing is made of the basic pattern to be repeated over the mask. The artwork is then reduced photographically using a normal graphic-arts camera. At this point one or the other of two different methods is followed:

(1) The first-reduction image is stepped-and-repeated over a photographic plate to produce the repetitive pattern of the desired mask. This repetitive pattern is then reduced photographically to the final mask size.

(2) The first-reduction image is immediately reduced to the scale of the final mask. This second-reduction image is then stepped-and-repeated to produce the final mask. The first method avoids alignment errors between corresponding patterns on different masks of a set, but cannot satisfactorily reproduce lines of less than about 5 microns width because of the difficulty of achieving high optical definition over a final image area of 1 inch x 1 inch. The second method allows higher optical definition, but alignment errors are determined by the mechanical accuracy of the step-and-repeat, being typically of the order of 1 micron.

Summary of the invention

The object of the present invention is to provide a method and apparatus which will assist in overcoming the defects of the methods at present in use.

The invention consists in a method of producing a mask set for use in the manufacture of planar transistors and integrated circuits wherein large scale artwork for each pattern of a pattern set is prepared in any suitable manner, the patterns are then each reduced photographically to a size of the order of 1 inch x 1 inch or other convenient dimensions and reproduced as an array or pattern set on a single photographic plate, the said photographic plate is then set up before a plurality of high resolution microscope objective type lenses spaced apart to correspond with the spacing of the patterns on said plate, a second photographic plate is then placed in the focusing plane of said objectives, all said patterns are then exposed simultaneously and a step-and-repeat procedure carried out to produce on said second photographic plate a mask set consisting of one mask in respect of each pattern.

Where a number of pattern sets are required to produce a mask set the latter part of the procedure is repeated with each pattern set plate.

The invention further consists in apparatus for carrying out the method defined in the last preceding paragraph consisting of a plurality of microscope objective type lenses mounted in a common housing with their optical axes parallel and focusing in a common plane, photographic plate holder means whereby an exposed photographic plate containing a pattern set may be presented to all said lenses simultaneously, photographic plate mounting means whereby a photographic plate may be mounted with its surface in said common plane, and within the fields of said lenses, and means for translating said photographic plate mounting means in two directions at right angles in said common plane.

Brief description of the drawings

In order that the invention may be better understood and put into practice a preferred form thereof is hereinafter described, by way of example, with reference to the accompanying drawings in which:

FIG. 4 is a plan view of the apparatus shown in FIG. 1, FIG. 5 illustrates the effect of slight angular rotation of the table during step-and-repeat translation, and FIG. 6 illustrates the means for correcting differences in the focal length of the microscope objectives.

Description of the preferred embodiment

Figure 1:
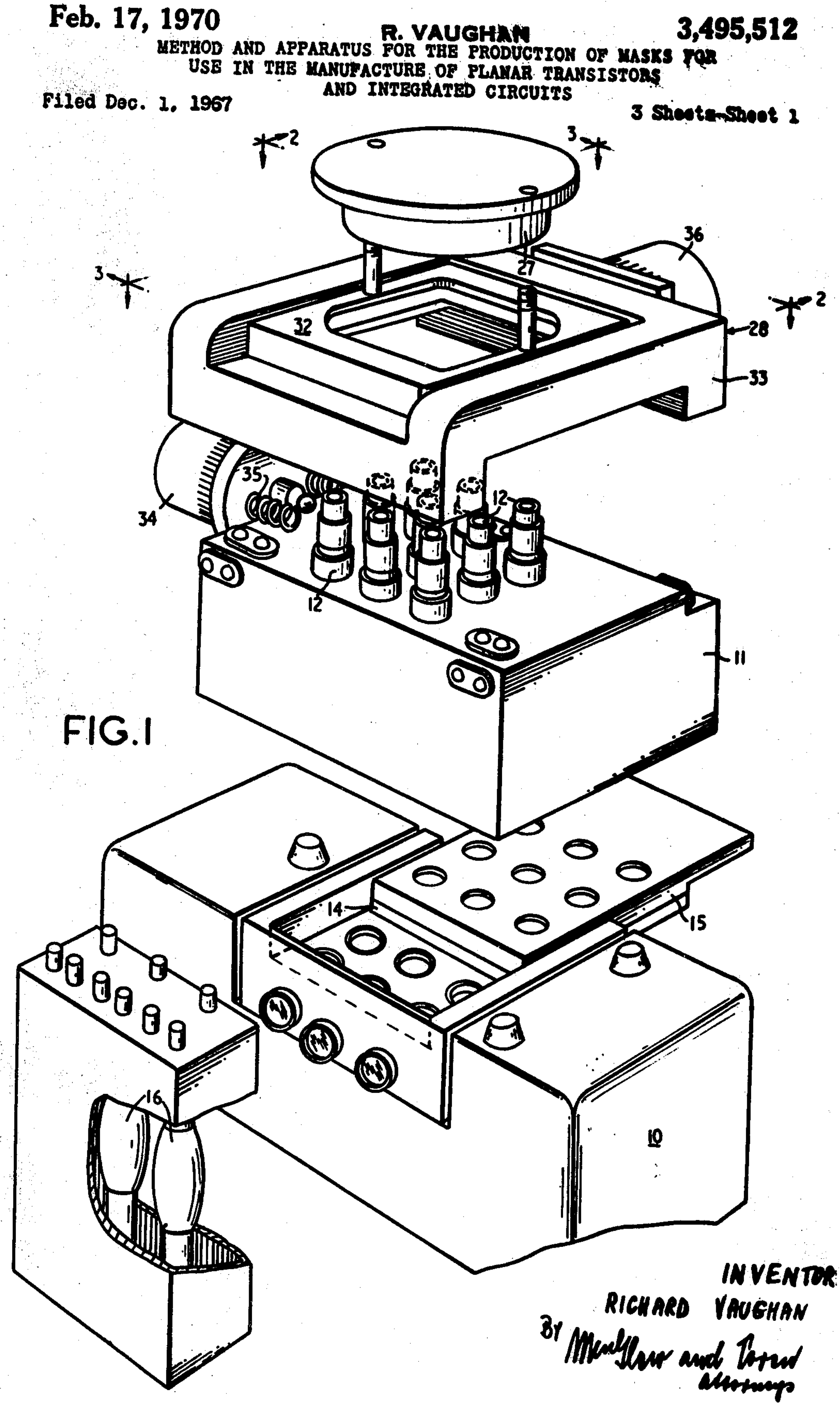
FIG. 1 is an exploded perspective view of apparatus for carrying out the second stage reduction.

The invention will be described in relation to the preparation of a mask set for an integrated circuit. In the production of such a circuit it is normally desirable to produce on a mask set basic pattern sets of different types, for example:

Type A.—circuit patterns
Type B.—test patterns
Type C.—alignment patterns

Let 1A, 2A, . . . 9A denote corresponding patterns of pattern set A on masks 1, 2, . . . 9 of the mask set.

Let 1B, 2B, . . . 9B denote corresponding patterns of pattern set B on masks 1, 2, . . . 9 of the mask set.

Let 1C, 2C, . . . 9C denote corresponding patterns of pattern set C on masks 1, 2, . . . 9 of the mask set, . . . etc.

Beginning with conventional artwork for each of the corresponding patterns 1A, 2A, . . . 9A of a pattern set, a first stage reduction camera with step-and-repeat is used to reduce these patterns to 1 inch x 1 inch size and to expose them as a 3 x 3 array on a suitable single photographic plate approximately 3 inch x 3 inch. A similar 3 x 3 array is produced on a photographic plate for each of the different pattern sets B. C, . . . etc. The method and means for carrying out these steps are well understood and do not require further description.

The second stage reduction is made using a special apparatus shown in FIGS. 1 to 4. This apparatus consists of a base 10 made, for example, of cast iron to give stability and rigidity, on which is mounted a housing 11 of tool steel containing nine identical high resolution microscope objective lenses 12 all focusing in the plane indicated at 13 in FIGS. 2 and 3.

A photographic plate 14 prepared as described above is mounted in the plate holder 15 so that each of the patterns of the pattern set is arranged opposite one of the lenses 12.

Figure 3:
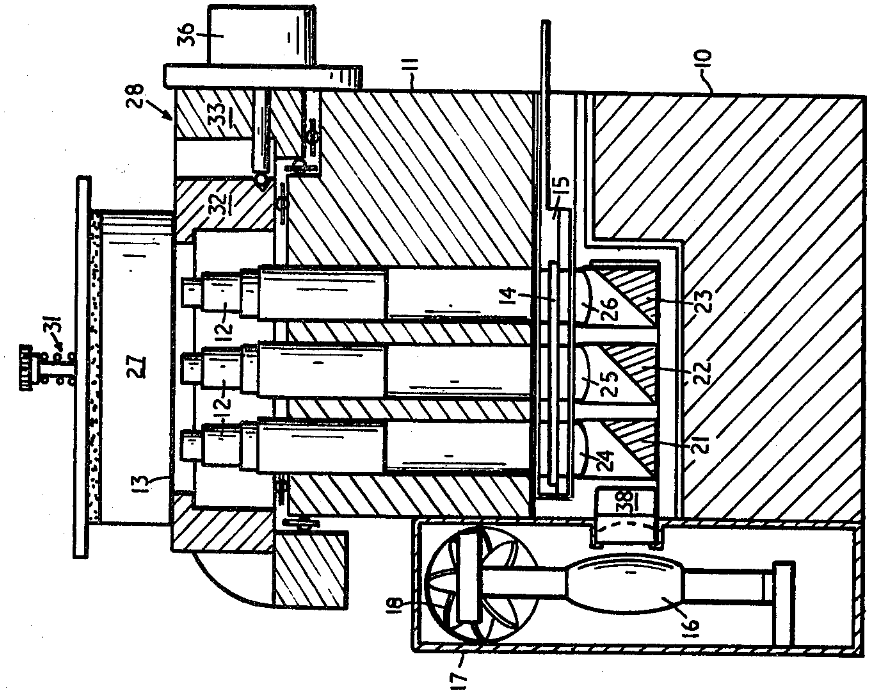
FIG. 3 is a sectional view through the apparatus shown in FIG. 1 on plane 3—3.
Figure 2:
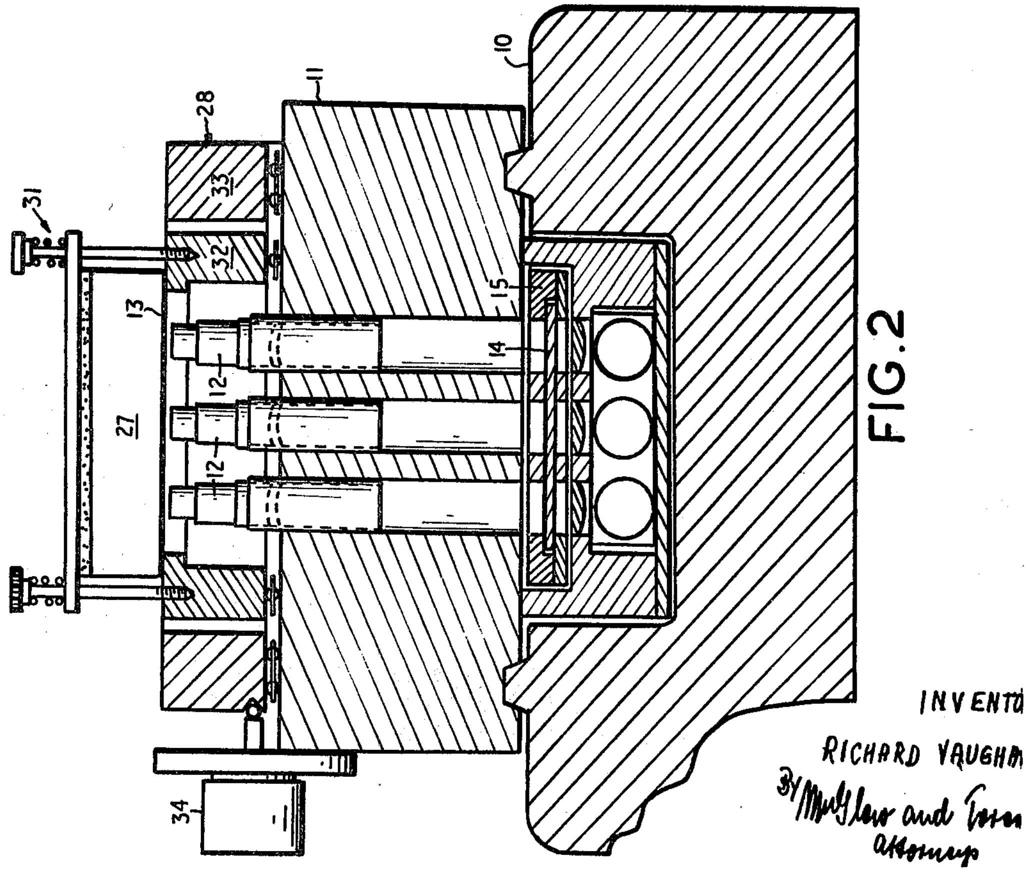
FIG. 2 is a sectional view through the apparatus shown in FIG. 1 on plane 2—2.

Light is supplied by means of three mercury vapor lamps 16 mounted in a housing 17 and cooled by the fan 18 (FIG. 3). Each lamp 16 supplies light to one row of lenses 12 through three prisms 21, 22 and 23 (FIG. 3) and condenser lenses 24, 25 and 26. Prism 21 reflects one third of the light received, prism 22 one half and prism 23 all light received so that each lens 12 receives one third of the light available.

A photographic plate 27 of the photoresist chrome film-on-glass type is mounted on a compound table indicated generally at 28 by means of which it may be translated in the $x$ and $y$ directions. The plate 27 which is 6" in diameter and 1½" thick is held in place by means of the spring loaded holder 31 so that its sensitised face which is optically flat to about $\pm 0.3\mu$ lies in the focal plane 13 of the lenses 12.

The compound table 28 is made up of an inner table 32 which moves in both the $x$ and $y$ directions and an outer table 33 which moves only in the $x$ direction both inner and outer tables being made of tool steel and being supported on the housing 11 by ball bearings mounted in suitable carriers. The surfaces of each table and the housing over which the ball bearings move are lapped so as to be flat within about one tenth of a micron to ensure the necessary precision in the movement of the plate 27 in relation to the plane 13.

The outer table 33 is moved by the micrometer screw 34 and return springs 35 in the $x$ direction, the inner table 32 being moved simultaneously.

The inner table 32 is moved in the $y$ direction by the micrometer screw 36 and return springs 37.

Three shutters 38 are included in front of the mercury vapor lamps 16 so that the plate 27 may be exposed for the appropriate time.

The 1" x 1" pattern array for all masks of a mask set is produced on the plate 27 by exposing all the patterns on the plate 14 simultaneously and then carrying out a step-and-repeat procedure in the $x$ and $y$ directions by moving tables 32 and 33 until the complete mask set is formed on the plate 27 which is then processed in a known manner.

In a modified form of apparatus if exposure is made by a xenon flash lamp, plate 27 can be translated continuously without blurring of the pattern. For example with a $5\mu$ sec. exposure time, and a 0.2 in./sec. table speed, blurring is less than 1 micro. in. and a complete array could be produced in approximately 2 minutes.

Errors

I am not interested in the spacing between individual patterns on a mask (provided this is sufficiently accurate to avoid material wastage, dicing problems, or second and third level interconnection problems in large-scale array systems), but only in accurate alignment of corresponding patterns on the different masks of a mask set. Errors in alignment can arise from three causes:

(1) Slight angular rotation of the table T during step-and-repeat translations.—Referring to FIG. 5, suppose that while exposing row $j$, table T translates through 1" in the $x$-direction and due to inaccuracies in the slide mechanism, also rotates a small angle $\theta$ about an axis which I shall take as coinciding with the optical axis of microscope objective number 5. Then it is easily seen that the alignment error between the last exposed $j$-row patterns of masks 4 and 6 will be approximately $\delta=2\theta$ in. If the table slides against bearing surfaces A and A' 8" apart as shown in FIG. 5, being held against these surfaces by spring force S and the surface irregularity of these bearing surfaces was $\delta'$ in., then approximately $$\theta=\frac{\delta'}{4} \text{ and } =\frac{\delta'}{2}$$

Assuming a surface finish of $\delta'=2$ micro. in., an alignment error of $\delta=1$ micro. in. does not seem unreasonable. Similar considerations hold for the accuracy of translation in the $y$-direction. However these two translation directions do not have to be accurately orthogonal.

(2) Changes in the spacing of the microscope objectives optical axes relative to the final photographic plate.—If such change occurs during the exposure period, alignment errors will be caused directly equal to the magnitude of the changes. Such differential changes could be caused by temperature changes during the exposure period, and could be minimised by matching the thermal coefficient of expansion of the microscope objective housing to that of the photographic plate. A difference in expansion coefficient of 1 p.p.m. will require temperature stability of 1° C. for a 1 micro. in. error over a 1" x 1" area. (Note that for similar reasons the expansion coefficient of the glass plate should be matched to that of the semiconductor wafer to avoid alignment errors in contact printing the different masks of a mask set onto the wafer. The expansion coefficient of silicon is $2.3\times10^{-6}$ at 25° C.)

(3) Errors in alignment of the corresponding patterns of different pattern set first reduction plates.—If only a single pattern set is used, the spacing between patterns on the first-reduction plate need only correspond sufficiently closely to the spacing between the optical axes of the microscope objectives to avoid off-axis aberrations. However if more than one pattern set is used (as is always the case) spacings on the first-reduction plate must be the same for all, otherwise while each pattern set will align with itself in the final mask-set, they will not align with each other. It can be seen that $$\text{alignment errors in final mask-set} = \frac{\text{spacing errors in first reduction}}{\text{second stage reduction factor}}$$

Using a second stage reduction factor of from 50 to 100 times, 1 micro. in. alignment errors would require spacing accuracies of from 50 to 100 micro. in. This is quite practical with present step-and-repeat mechanisms (for example the David Mann instrument). Finally it may be remarked that the method of producing all patterns of a pattern set on a single plate completely avoids all angular alignment problems which otherwise would have to be made to 1 micro. in./25 mils$=40\times10^{-6}$ rod$\doteq$5 sec. of arc.

(4) Differences in the focal-lengths of the microscope objectives.—In addition to alignment errors caused by variation in the spacing between corresponding patterns of the final mask-set, such corresponding patterns must align over the full area of the pattern. If errors are to be held to 1 micro. in. at the edges of a typical $50\times10^{-3}$ in. by $50\times10^{-3}$ in. pattern, the second stage reduction factor M must be the same for each of the microscope objectives to within 1 part in 25,000. Since the distance between the object and image is identical for all objectives, translation of each objective to give focus will not simultaneously give equal magnification unless the focal lengths of all objectives are identical (to within 1 part in 25,000). An additional degree of freedom or means of adjustment is necessary, and while this might be achieved in a number of ways, one method is illustrated in FIG. 6.

A low-power (that is long focal length) supplementary lens L2 is placed between the microscope objective L1 and the object plane O (that is the pattern set plate) near to the object plane. If $f_1$, $H_1$ and $f_2$, $H_2$ are the focal length and the distance between the principal planes of the objective L1 and the supplementary lens L2, respectively, then the distance L between the object and image planes O and I for the combined optical system is given by $$L=H_1+H_2+\frac{\frac{(1+M)^2}{M}f_1f_2+D^2}{D+f_1+f_2}$$

where M is the reduction factor or magnification ratio and D is the spacing between "adjacent" principal planes of the two lenses.

For fixed L and M, variations in $f_1$ can be corrected by adjustment of D. In practice a successive adjustment procedure would be made whereby the microscope objective would be translated to give focus in the image plane and the supplementary lens then translated to give the correct reduction ratio. These two adjustments are largely independent. Typical values might be $M=50$, $f_1=+0.5$ cm., $f_2=+25$ cm., $D=25$ cm., so that if variations in focal length between microscope objectives were $\pm1\%$ (a typical figure for commercially produced objectives), correction could be made by a range of adjustment for D of $\pm0.5$ cm. with a fineness of adjustment of D of $0.5\times10^{-3}$ in. Since the supplementary lens is of low power (compared to the microscope objective) and passes only rays close to the optical axis, negligible additional optical aberration will be introduced.

It is of course necessary that the above magnification adjustment once made should remain constant over a reasonable period of time. It may be remarked that the same requirement exists for single-lens photo repeater equipment (for example the Davis Mann instrument) where the magnification ratio must remain constant during the period required to expose singularly all the masks of a mask-set.

Advantages (1) Alignment errors between masks of a mask-set are negligible.

(2) A pattern set plate or a master mask-set plate need never be cut into individual patterns or masks. Patterns or masks of a set cannot become lost, interchanged, etc. Photographic processing, handling, storing, etc. are simplified.

(3) A "library" of different pattern sets can be built up and combined as needed to form mask-sets for large scale arrays containing perhaps many different pattern sets. Pattern sets may be for different circuit functions, or for test, process control or alignment purposes. Placing a pattern set in the final reduction camera is a very quick and simple process. Since it need be located to a mil. or so only (see errors, section 3), standard sized plates can be used and located by being pressed against two of their sides.

What I claim is:

1. A method of producing a mask set including plural pattern sets for use in the manufacture of planar transistors and integrated circuits comprising the steps of preparing large scale artwork for each pattern of each pattern set; reducing each of the patterns of each pattern set photographically to a size substantially of the order of one inch by one inch while reproducing all of the patterns of each pattern set as an array or pattern set on a single respective photographic plate; providing a plurality of substantially identical high resolution microscope objective type lenses in a number equal to the number of patterns in each set and at respective locations corresponding to the respective locations of the patterns of each set, all of the microscope lenses focusing in a single common focusing plane; positioning a single respective photographic plate before the plurality of microscopes; positioning a second photographic plate in said common focusing plane; simultaneously exposing all the patterns on the thus positioned single respective photographic plate to reproduce, on the second photographic plate, a respective mask; and repeating the procedure step-by-step with each additional single respective photographic plate to reproduce, on the second photographic plate, a mask set including each of said pattern sets.

2. Apparatus for producing a mask set including plural pattern sets for use in the manufacture of planar transistors and integrated circuits, said apparatus comprising, in combination, a rigid, stable mounting base; a lens housing mounted on the upper surface of said base; a number of substantially identical high resolution microscope objective lenses mounted in said housing and all focusing in a single common focusing plane substantially parallel to the planar upper surface of said lens housing and spaced above said upper surface of said lens housing, said lenses being arranged in columns and rows at the intersections of a rectangular grid; a lamp housing mounted on a side surface of said base; a number of lamps equal to the number of rows of said grid, mounted in said housing and each aligned with a respective row of said grid; a number of optical systems in said base each extending along a respective row of said grid and each directing light from a respective lamp equally through all the lenses of the associated row; said base being formed with a substantially rectangular slot in its upper surface, between said optical systems and said lenses; a plate holder removably received in said slot and interchangeably carrying first photographic plates each having reproduced thereon all of the patterns of a respective pattern set as a rectangular grid array, coincident with said first-mentioned rectangular grid, and with each pattern at a respective intersection of the rectangular grid for alignment with a respective lens; photographic plate mounting means on said upper surface of said lens housing and having a photographic plate mounting surface coincident with said single common focusing plane and arranged to receive a second photographic plate; retaining means holding said second photographic plate on said mounting means; and means operable to translate said photographic plate mounting means in two mutually perpendicular directions parallel to said single common focusing plane.

3. Apparatus as claimed in claim 2, in which said photographic plate mounting means comprises a compound table including a first movable table formed with an aperture extending over an area above said lenses, and a second movable table surrounding said first table; said first movable table carrying clamp means for securing said second photographic plate thereto; first micrometer means operable to move both said tables simultaneously in one of said directions; and second micrometer means operable to move said first table relative to said second table in the other of said directions.

4. Apparatus as claimed in claim 3, including all bearings supporting said first and second table on the upper surface of said lens housing; the portion of the upper surface of said lens housing over which said ball bearings move being lapped to be optically flat.

5. Apparatus as claimed in claim 2, in which said lamps are mercury vapor lamps.

6. Apparatus as claimed in claim 2, in which said lamps are xenon lamps.

References Cited

UNITED STATES PATENTS

| | | | |
|---|---|---|---|
| 3,247,761 | 4/1966 | Herreman et al. | 95—4.5 X |
| 3,330,182 | 7/1967 | Gerber et al. | 95—1 |
| 3,342,539 | 9/1967 | Nelson et al. | 95—4.5 |

JOHN M. HORAN, Primary Examiner

RICHARD A. WINTERCORN, Assistant Examiner

U.S. Cl. X.R.

95—4.5; 355—46, 53, 77, 95